US008901207B2

(12) United States Patent
Hayakawa et al.

(10) Patent No.: US 8,901,207 B2
(45) Date of Patent: Dec. 2, 2014

(54) ADHESIVE FOR ELECTRONIC COMPONENTS

(75) Inventors: Akinobu Hayakawa, Osaka (JP); Hideaki Ishizawa, Osaka (JP); Kohei Takeda, Osaka (JP); Ryohei Masui, Osaka (JP)

(73) Assignee: Sekisui Chemical Co., Ltd., Osaka (JP)

( * ) Notice: Subject to any disclaimer, the term of this patent is extended or adjusted under 35 U.S.C. 154(b) by 237 days.

(21) Appl. No.: 13/146,571

(22) PCT Filed: Jan. 29, 2010

(86) PCT No.: PCT/JP2010/051253
§ 371 (c)(1),
(2), (4) Date: Aug. 30, 2011

(87) PCT Pub. No.: WO2010/087444
PCT Pub. Date: Aug. 5, 2010

(65) Prior Publication Data
US 2012/0016057 A1  Jan. 19, 2012

(30) Foreign Application Priority Data

Jan. 29, 2009  (JP) ................................. 2009-018390

(51) Int. Cl.
*C09J 171/02* (2006.01)
*C09J 163/00* (2006.01)
*C09J 133/06* (2006.01)
*H01L 23/29* (2006.01)
*H01L 23/00* (2006.01)
*C08L 33/06* (2006.01)
*C08L 63/00* (2006.01)

(52) U.S. Cl.
CPC ............ *C09J 171/02* (2013.01); *C09J 133/062* (2013.01); *C09J 163/00* (2013.01); *H01L 23/295* (2013.01); *H01L 24/29* (2013.01); *C08L 33/062* (2013.01); *C08L 63/00* (2013.01)
USPC .......... 523/467; 523/404; 523/428; 525/109; 525/114; 525/117; 528/377; 528/378; 528/380

(58) Field of Classification Search
CPC ... C08G 59/3209; C08G 75/08; C09J 163/08; C09J 163/10
See application file for complete search history.

(56) References Cited

U.S. PATENT DOCUMENTS

| 6,528,595 | B1 * | 3/2003 | Ikawa et al. ................. 525/525 |
| 6,559,269 | B2 * | 5/2003 | Okuhira et al. ............... 528/94 |
| 7,838,577 | B2 * | 11/2010 | Hayakawa et al. ............ 524/1 |
| 7,915,743 | B2 * | 3/2011 | Ishizawa et al. ............. 257/783 |
| 8,420,718 | B2 * | 4/2013 | Ando et al. ................... 524/83 |
| 2005/0208296 | A1 * | 9/2005 | Saiki et al. ................. 428/343 |
| 2006/0147719 | A1 * | 7/2006 | Rubinsztajn et al. ......... 428/413 |
| 2007/0029682 | A1 * | 2/2007 | Aoki et al. .................. 257/793 |
| 2009/0030158 | A1 * | 1/2009 | Amano et al. ............... 525/403 |
| 2010/0197830 | A1 | 8/2010 | Hayakawa et al. |

FOREIGN PATENT DOCUMENTS

| JP | 2000-072851 | A | | 3/2000 | |
| JP | 2003-268071 | A | | 9/2003 | |
| JP | 2005-268613 | A | | 9/2005 | |
| JP | 2006-028250 | A | | 2/2006 | |
| JP | 2006-117824 | A | | 5/2006 | |
| JP | 2006160953 | A | * | 6/2006 | |
| JP | 2007197578 | A | * | 8/2007 | |
| TW | 200533714 | A | | 10/2005 | |
| TW | 200808932 | A | | 2/2008 | |
| WO | WO-2005/062369 | A1 | | 7/2005 | |
| WO | WO 2008/010555 | | * | 1/2008 | ............. C09J 11/04 |
| WO | WO-2009/011383 | A1 | | 1/2009 | |

OTHER PUBLICATIONS

Machine translation of JP 2006160953.*
Machine translation of JP 2007197578.*

* cited by examiner

*Primary Examiner* — Mark Kaucher
*Assistant Examiner* — Kregg Brooks
(74) *Attorney, Agent, or Firm* — Novak Druce Connolly Bove + Quigg LLP

(57) ABSTRACT

It is an object of the present invention to provide an adhesive for electronic components that prevents warpage of electronic components and reflow cracks even in the case of bonding thin electronic components. The present invention relates to an adhesive for electronic components, comprising: an epoxy compound having an aliphatic polyether backbone and a glycidyl ether group; an epoxy group-containing acrylic polymer; an episulfide compound; and a curing agent, wherein the amount of the episulfide compound is 1 parts by weight or more, and less than 30 parts by weight relative to 100 parts by weight of the epoxy compound having an aliphatic polyether backbone and a glycidyl ether group.

6 Claims, No Drawings

ADHESIVE FOR ELECTRONIC COMPONENTS

CROSS REFERENCE TO RELATED APPLICATIONS

This application is a National Phase filing under 35 U.S.C. §371 of PCT/JP2010/051253 filed on Jan. 29, 2010; and this application claims priority to Application No. 2009-018390 filed in Japan on Jan. 29, 2009 under 35 U.S.C. §119; the entire contents of all are hereby incorporated by reference.

TECHNICAL FIELD

The present invention relates to an adhesive for electronic components that prevents warpage of electronic components and reflow cracks even in the case of bonding thin electronic components.

BACKGROUND ART

Increasingly smaller electronic components such as semiconductor chips have been required recently, and for example, thinner semiconductor chips are produced. Warpage occurs in electronic components upon boding electronic components, or electronic components and substrates, with an adhesive. This has become an important issue. Semiconductor chips are mounted on a substrate by reflow soldering (heating the entire substrate with infrared rays and the like), and a package is heated to a high temperature of 200° C. or higher. Then, moisture contained in the package, especially in an adhesive layer rapidly evaporates and expands to cause package cracks and reduction in reliability of a semiconductor device. Accordingly, there is a demand for solving the problem of reflow cracks at high levels.

In order to prevent warpage, an adhesive for electronic components is generally designed so that a cured product thereof has a low elastic modulus. However, reflow crack resistance tends to be deteriorated in the case of using an adhesive for electronic components, whose cured product has a low elastic modulus. Warpage and reflow cracks are less likely to be simultaneously prevented.

Patent Document 1 proposes a resin paste containing a specific imide compound, a liquid rubber compound such as epoxidized polybutadiene, a radical initiator, and a filler in order to prevent warpage and reflow cracks. Patent Document 1 suggests that, since a cured product of such a resin paste has a low stress, warpage and reflow cracks can be prevented. However, in the case that a thin semiconductor chip having a thickness of about tens of micrometers is bonded to a substrate with the resin paste described in Patent Document 1, problematically, the elastic modulus of the cured resin is high and a chip has a large warpage.

Patent Document 2 discloses an epoxy resin composition containing an epoxy resin and an episulfide resin, as an epoxy resin composition with improved reflow crack resistance particularly to copper. Patent Document 2 discloses that bisphenol A episulfide resin is preferable as the episulfide resin, and bisphenol epoxy resin is preferable as the epoxy resin. However, also upon using the epoxy resin composition described in Patent Document 2, problematically, the elastic modulus of a cured resin is high and a semiconductor chip having a thickness of about tens of micrometers has a large warpage.

RELATED ART DOCUMENTS

Patent Documents

Patent Document 1: Japanese Kokai Publication 2000-072851 (JP-A 2000-072851)

Patent Document 2: Japanese Kokai Publication 2003-268071 (JP-A 2003-268071)

SUMMARY OF THE INVENTION

Problems to be Solved by the Invention

It is an object of the present invention to provide an adhesive for electronic components that prevents warpage of electronic components and reflow cracks even in the case of bonding thin electronic components.

Means for Solving the Problems

The present invention relates to an adhesive for electronic components, comprising: an epoxy compound having an aliphatic polyether backbone and a glycidyl ether group; an epoxy group-containing acrylic polymer; an episulfide compound; and a curing agent, wherein the amount of the episulfide compound is 1 part by weight or more, and less than 30 parts by weight, relative to 100 parts by weight of the epoxy compound having an aliphatic polyether backbone and a glycidyl ether group.

Hereinafter, the present invention will be described in detail.

The present inventors have investigated the mechanism of reflow cracks in detail. As a result, they have found that reflow cracks have two patterns: interfacial peeling caused by poor adhesion between a substrate and electronic components or between electronic components; and cohesive peeling caused by insufficient crosslinking. As a result of further earnest investigations based on this analysis, they have found that the combined use of an epoxy compound having an aliphatic polyether backbone and glycidyl ether, an epoxy group-containing acrylic polymer, and an episulfide compound leads to simultaneous prevention of warpage of electronic components and reflow cracks, leading to completion of the present invention.

As the epoxy compound having an aliphatic polyether backbone and glycidyl ether is used as a main component, a cured product to be provided is flexible and warpage can be prevented. The epoxy group-containing acrylic polymer exerts the effect of improving the cohesive force of the adhesive for electronic components, and can prevent reflow cracks caused by cohesive peeling. In addition, the episulfide compound has higher adhesion to electronic components and substrates than an epoxy compound has, and can prevent reflow cracks caused by interfacial peeling. However, the episulfide compound has higher reactivity than an epoxy compound, and has the effect of increasing the degree of crosslinkage of the cured product of the adhesive for electronic components to cause a higher elastic modulus. Accordingly, it is important to adjust the amount so as not to trigger warpage.

The adhesive for electronic components of the present invention contains an epoxy compound (hereinafter, also referred to as an "epoxy compound (A1)") having an aliphatic polyether backbone and a glycidyl ether group. Examples of the aliphatic polyether backbone include a propylene glycol backbone and a polytetramethylene glycol backbone. Since the adhesive contains the epoxy compound (A1) having such an aliphatic polyether backbone, the flexibility of the cured product of the adhesive for electronic components of the present invention can be enhanced, and warpage can be prevented.

Examples of the epoxy compound (A1) include polytetramethylene glycol diglycidyl ether, polypropylene glycol diglycidyl ether, polyethylene glycol diglycidyl ether, and polyhexamethylene glycol diglycidyl ether. Of these, polytetramethylene glycol diglycidyl ether and polypropylene glycol diglycidyl ether are preferable from the viewpoint of further improvement in the flexibility of the cured product of the adhesive for electronic components.

Preferably, the epoxy compound (A1) has a number-average molecular weight of 800 in the lower limit and 10000 in the upper limit. A number-average molecular weight of the epoxy compound (A1) of less than 800 may inhibit sufficient flexibility of the cured product of the adhesive for electronic components. A number-average molecular weight of the epoxy compound (A1) exceeding 10000 may lead to a high viscosity of the adhesive for electronic components, and may deteriorate the workability upon bonding electronic components. More preferably, the number-average molecular weight of the epoxy compound (A1) is 850 in the lower limit and 2000 in the upper limit. Further preferably, it is 900 in the lower limit and 1500 in the upper limit.

The "number-average molecular weight" used herein is a value measured by gel permeation chromatography (GPC) with polystyrene used as a standard. The gel permeation chromatography is performed with a measurement device produced by Nihon Waters K. K. (column: Shodex GPC LF-804 (length: 300 mm) (produced by Showa Denko K.K.)× 2, measurement temperature: 40° C., flow rate: 1 mL/min, solvent: tetrahydrofuran, standard: polystyrene), for example.

The viscosity of the epoxy compound (A1) measured with an E type viscometer at 23° C. and 5 rpm is preferably 500 mmPa or less. A viscosity of the epoxy compound (A1) of 500 mmPa or less can further improve the coatability of the adhesive for electronic components.

Examples of commercial products of the epoxy compound (A1) include Epogosey PT (produced by Yokkaichi Chemical Company, Limited, polytetramethylene glycol diglycidyl ether) and EX-841 (produced by Nagase ChemteX Corporation, polyethylene glycol diglycidyl ether).

The adhesive for electronic components of the present invention contains an epoxy group-containing acrylic polymer. Since the adhesive contains the epoxy group-containing acrylic polymer, the epoxy group reacts with the epoxy compound (A1), and the acrylic polymer backbone increases the breaking strength of the cured product of the adhesive for electronic components. Therefore, reflow cracks caused by cohesive peeling can be effectively prevented.

The epoxy group-containing acrylic polymer preferably has the backbone comprised of acrylic polymer and the epoxy group in the side chain.

Preferably, the epoxy group-containing acrylic polymer has an epoxy equivalent of 300 in the lower limit and 1000 in the upper limit. An epoxy equivalent of the epoxy group-containing acrylic polymer of less than 300 may cause too high a crosslink density and a large elastic modulus of the cured product of the adhesive for electronic components. Accordingly, warpage may not be prevented. An epoxy equivalent of the epoxy group-containing acrylic polymer exceeding 1000 may cause the adhesive to have few crosslinking points and lead to too low a crosslink density. Accordingly, reflow cracks caused by cohesive peeling may not be prevented. More preferably, the epoxy equivalent of the epoxy group-containing acrylic polymer is 400 in the lower limit and 800 in the upper limit.

Preferably, the epoxy group-containing acrylic polymer has a number-average molecular weight of 5000 in the lower limit and 50000 in the upper limit. A number-average molecular weight of the epoxy group-containing acrylic polymer of less than 5000 may lead to failure of prevention of reflow cracks caused by cohesive peeling. A number-average molecular weight of the epoxy group-containing acrylic polymer exceeding 50000 may lead to low compatibility with other components. More preferably, the epoxy group-containing acrylic polymer has a number-average molecular weight of 7000 in the lower limit and 20000 in the upper limit.

Examples of commercial products of the epoxy group-containing acrylic polymer include CP-30 (produced by NOF Corporation, epoxy equivalent: 530, number-average molecular weight: 9000), CP-50S (produced by NOF Corporation company, epoxy equivalent: 310, number-average molecular weight: 20000), and CP-20SAP (produced by NOF Corporation, epoxy equivalent: 750, number-average molecular weight: 8000).

The amount of the epoxy group-containing acrylic polymer is preferably 4 parts by weight in the lower limit and 40 parts by weight in the upper limit, relative to 100 parts by weight of the epoxy compound (A1). An amount of the epoxy group-containing acrylic polymer of less than 4 parts by weight may lead to failure of prevention of reflow cracks caused by cohesive peeling. An amount of the epoxy group-containing acrylic polymer exceeding 40 parts by weight may cause a high viscosity and low workability upon bonding electronic components. More preferably, the amount of the epoxy group-containing acrylic polymer is 10 parts by weight in the lower limit and 30 parts by weight in the upper limit.

The adhesive for electronic components of the present invention contains an episulfide compound. The episulfide compound has higher adhesion to electronic components and substrates than an epoxy compound has. The adhesive containing a predetermined amount of the episulfide compound to the epoxy compound (A1) can effectively prevent reflow cracks caused by interfacial peeling with a substrate. In addition, the elastic modulus can also be adjusted, and warpage can be prevented.

There are no particular limitations on the episulfide compound provided it has an episulfide group. Examples thereof include an episulfide compound in which an oxygen atom of the epoxy group of the epoxy resin is replaced with a sulfur atom.

Examples of the episulfide compound include a bisphenol episulfide compound (compound in which an oxygen atom of the epoxy group of the bisphenol epoxy resin is replaced with a sulfur atom) and a hydrogenated bisphenol episulfide compound. The hydrogenated bisphenol episulfide compound is preferable among these because it is liquid and does not unnecessarily increase the viscosity of the adhesive for electronic components.

Examples of commercial products of the hydrogenated bisphenol episulfide compound include YL-7007 (produced by Japan Epoxy Resins Co., Ltd., hydrogenated bisphenol A episulfide compound).

The amount of the episulfide compound is 1 part by weight or more, and less than 30 parts by weight, relative to 100 parts by weight of the epoxy compound (A1). An amount of the episulfide compound of less than 1 part by weight leads to failure of prevention of reflow cracks caused by interfacial peeling. An amount of the episulfide compound of 30 parts by weight or more leads to a high elastic modulus of the cured product of the adhesive for electronic components, resulting in failure of prevention of warpage. Preferably, the amount of the episulfide compound is 5 parts by weight in the lower limit and 20 parts by weight in the upper limit.

The adhesive for electronic components of the present invention preferably contains an epoxy compound (A2) having an aromatic skeleton and a molecular weight of 150 to 500, in addition to the above epoxy compound (A1).

The epoxy compound (A2) can increase the elastic modulus of the cured product of the adhesive for electronic components to be provided, at high temperatures, and can improve the adhesion reliability. In addition, the curing speed of the adhesive for electronic components may be high, and warpage of electronic components can be further suppressed.

A molecular weight of the epoxy compound (A2) of less than 150 may allow the epoxy compound (A2) to volatilize during heat curing. A molecular weight of the epoxy compound (A2) exceeding 500 may cause an insufficient effect of enhancing the elastic modulus at high temperatures and curing speed. More preferably, the epoxy compound (A2) has a molecular weight of 200 in the lower limit and 300 in the upper limit. The molecular weight of the epoxy compound (A2) means a molecular weight that is calculated by the structural formula in the case that the structural formula of the epoxy compound (A2) is specified. The molecular weight refers to a number-average molecular weight in the case that the epoxy compound (A2) is a polymer and the structural formula cannot be specified.

Examples of the epoxy compound (A2) include an aniline epoxy compound, a dicyclopentadiene epoxy compound, a resorcinol epoxy compound, a naphthalene epoxy compound, and a biphenyl epoxy compound. Of these, an aniline epoxy compound and a resorcinol epoxy compound are preferable from the viewpoints of reducing the viscosity of the adhesive for electronic components and further improving the coatability.

Examples of the aniline epoxy compound include glycidyloxy-N,N-glycidyl aniline. Examples of commercial products of the aniline epoxy compound include EP-3900S and EP-3950 (both produced by ADEKA Corporation).

Examples of the resorcinol epoxy compound include m-resorcinol diglycidyl ether and o-resorcinol diglycidyl ether. Examples of commercial products of the resorcinol epoxy compound include EX-201 and EX-203 (both produced by Nagase ChemteX Corporation).

The amount of the epoxy compound (A2) is preferably 1 part by weight in the lower limit and 20 parts by weight in the upper limit, relative to 100 parts by weight of the epoxy compound (A1). An amount of the epoxy compound (A2) of less than 1 part by weight may inhibit the effect of enhancing the elastic modulus at high temperatures. An amount of the epoxy compound (A2) exceeding 20 parts by weight may lead to low flexibility of the cured product of the adhesive for electronic components of the present invention. Accordingly, warpage may not be prevented. More preferably, the amount of the epoxy compound (A2) is 3 parts by weight in the lower limit and 10 parts by weight in the upper limit.

The adhesive for electronic components of the present invention contains a curing agent.

The curing agent is not particularly limited, and conventional curing agents can be used. Specific examples include: acid anhydride curing agents such as trialkyltetrahydrophthalic anhydride and succinic anhydride; latent curing agents such as a phenol curing agent, an amine curing agent, and dicyandiamide; and cationic catalytic curing agents. These curing agents may be used independently, or two or more kinds thereof may be used in combination. Of these, acid anhydride curing agents are preferable from the viewpoint of high adhesion reliability, and an acid anhydride containing a double bond is more preferable. An acid anhydride containing a double bond enhances the flexibility of the cured product of the adhesive for electronic components and reduces warpage of electronic components.

Examples of the acid anhydride containing a double bond include dodecenyl succinic anhydride, tetrapropenyl succinic anhydride, and methylbutenyl tetrahydrophthalic anhydride.

Examples of commercial products of the acid anhydride containing a double bond include DDSA (produced by New Japan Chemical Co., Ltd., dodecenyl succinic anhydride), and YH-306 (produced by Japan Epoxy Resins Co., Ltd., methylbutenyl tetrahydrophthalic anhydride).

In the case where a curing agent which equivalently reacts is used, the amount of the curing agent is preferably 30 equivalents in the lower limit and 110 equivalents in the upper limit, relative to the total amount of 100 parts by weight of the curable functional groups of all the curable components (an epoxy compound (A1), an epoxy group-containing acrylic polymer, and an episulfide compound, and an epoxy compound (A2) to be mixed if necessary). If the curing agent functions as a catalyst, the preferable lower limit is 1 part by weight and the preferable upper limit is 20 parts by weight, relative to the total amount of 100 parts by weight of all the curable components.

The adhesive for electronic components of the present invention preferably further contains a curing accelerator. If the adhesive contains the curing accelerator, a curing speed and properties such as bonding reliability can be further improved.

Examples of the curing accelerator include an imidazole curing accelerator and a tertiary amine curing accelerator. Each of these curing accelerators may be used alone, or two or more of these may be used in combination. The imidazole curing accelerator is preferable among these from the viewpoint of easy control of the reaction system for adjusting a curing speed, properties of the cured product, and the like. An imidazole curing accelerator that is an epoxy adduct is more preferable among the imidazole curing accelerators. The imidazole curing accelerator that is an epoxy adduct enables curing at relatively low temperatures for a short period of time while maintaining storage stability.

Examples of the imidazole curing accelerator include: 1-cyanoethyl-2-phenylimidazole with the 1-position of imidazole protected by a cyanoethyl group; and a substance with the 1-position of imidazole protected by isocyanuric acid (2MA-OK produced by SHIKOKU CHEMICALS Corp. and PN-23J produced by Ajinomoto Co., Inc.).

Preferably, the amount of the curing accelerator is 1 part by weight in the lower limit and 20 parts by weight in the upper limit, relative to the total amount of 100 parts by weight of all the curable components. An amount of the curing accelerator of less than 1 part by weight may inhibit sufficient curing speed or bonding reliability. An amount of the curing accelerator exceeding 20 parts by weight may allow an unreacted curing accelerator to remain after curing.

The adhesive for electronic components of the present invention preferably further contains silica particles. In the case that the adhesive contains the silica particles, the thermal expansion of the cured product of the adhesive for electronic components can be suppressed, and the warpage of the electronic components can be prevented.

The silica particles are preferably surface-treated with a phenyl group-containing silane coupling agent. In the case that the silica particles are surface-treated with a phenyl group-containing silane coupling agent, the increase in viscosity can be suppressed even upon addition of the silica particles to the epoxy compound (A1), and the coatability of the adhesive for electronic components can be improved.

Examples of the phenyl group-containing silane coupling agent include phenyl trimethoxysilane and 3-(N-phenyl)aminopropyl trimethoxysilane.

Examples of a method of surface-treating silica particles with the phenyl group-containing silane coupling agent include: direct treatment methods; and an integral blending method in which the silane coupling agent is directly added upon mixing the silica particles and other components in preparation of the adhesive for electronic components. Specific examples of the direct treatment methods include: a method in which the silica particles are added to a mixer which can stir the content at a high speed, such as Henschel mixer or V-type mixer, and then the silane coupling agent is added directly to the mixer while stirring; a dry method in which the silica particles are added to a mixer which can stir the content at a high speed, such as Henschel mixer or V-type mixer, and then the silane coupling agent is added in the form of an aqueous alcohol solution, a solution in an organic solvent or an aqueous solution while stirring; a slurry method in which an organic silane coupling agent is added to the slurry of the silica particles; and a spraying method in which the silica particles are dried and the silane coupling agent is sprayed thereto.

Preferably, the amount of the silane coupling agent for surface-treating the silica particles with the phenyl group-containing silane coupling agent is 0.1 parts by weight in the lower limit and 15 parts by weight in the upper limit, relative to 100 parts by weight of silica particles. An amount of the phenyl group-containing silane coupling agent of less than 0.1 parts by weight may inhibit sufficient surface-treatment of the silica particles. An amount of the phenyl group-containing silane coupling agent exceeding 15 parts by weight may allow an unreacted silane coupling agent to remain, likely resulting in reduction in heat resistance of the cured product of the adhesive for electronic components.

Commercial products such as SE-4050-SPE (produced by Admatechs Company Limited) may be used as the silica particles surface-treated with the phenyl group-containing silane coupling agent.

Preferably, the amount of the silica particles is 50 parts by weight in the lower limit and 400 parts by weight in the upper limit, relative to 100 parts by weight of the epoxy compound (A1). An amount of the silica particles of less than 50 parts by weight may cause an insufficient effect of suppressing the thermal expansion of the cured product. An amount of the silica particles exceeding 400 parts by weight may cause an increase in viscosity and inferior coating stability. More preferably, the amount of the silica particles is 100 parts by weight in the lower limit and 200 parts by weight in the upper limit.

Preferably, the average particle diameter of the silica particles is 500 nm in the lower limit and 20 μm in the upper limit. An average particle diameter of the silica particles of less than 500 nm may lead to a remarkable increase in the viscosity caused by addition of silica. An average particle diameter of the silica particles exceeding 20 μm may lead to a large maximum particle diameter and an unnecessarily thick adhesive for bonding electronic components.

The adhesive for electronic components of the present invention preferably further contains spacer particles. In the case of bonding multiple electronic components with the adhesive for electronic components of the present invention containing such spacer particles, the distance between the electronic components can be kept constant.

The spacer particles preferably have a spherical shape.

The preferable upper limit of the aspect ratio of the spacer particles is 1.1. The spacer particles having an aspect ratio of 1.1 or less can allow electronic components to be stably laminated with a predetermined distance therebetween.

The aspect ratio herein represents a ratio of the major axis length to the minor axis length of the particles (the value obtained by dividing the length of the major axis by the length of the minor axis). The spacer particles having the aspect ratio closer to 1 have a shape closer to the perfect sphere.

The average particle diameter of the spacer particles may be appropriately adjusted so that the distance between the electronic components is within a desired range. The preferable lower limit thereof is 5 μm and the preferable upper limit thereof is 200 μm. An average particle diameter of the spacer particles of less than 5 μm may cause difficulty in narrowing the distance between the electronic components to the similar size of the particle diameter of the spacer particles. An average particle diameter of the spacer particles greater than 200 μm may cause electronic components to have a distance wider than required. The more preferable lower limit of the average particle diameter of the spacer particles is 9 μm and the more preferable upper limit thereof is 50 μm.

In the spacer particles, the CV value of the particle diameter is preferably 10% or less. A CV value of more than 10% may cause wide variations in particle diameters, and thus cause difficulty in keeping the distance constant between electronic components. The CV value of the particle diameter of the spacer particles is more preferably 6% or less, and further preferably 4% or less. The "CV value" used herein is a value obtained by the following formula:

$$\text{CV value (\%)} = (\sigma_2/Dn_2) \times 100$$

wherein $\sigma_2$ represents a standard deviation of particle diameters and $Dn_2$ represents a number average particle diameter.

The spacer particles are preferably resin particles made of resin or organic-inorganic hybrid particles.

Examples of the resins that form the resin particles include: non-crosslinked resins such as polyethylene, polypropylene, polymethyl pentene, polyvinyl chloride, polytetrafluoro ethylene, polystyrene, polymethyl methacrylate, polyethylene terephthalate, polybutylene terephthalate, polyamide, polyimide, polysulfone, polyphenylene oxide, and polyacetal; and crosslinked resins such as an epoxy resin, a phenol resin, a melamine resin, an unsaturated polyester resin, a divinylbenzene polymer, a divinylbenzene-styrene copolymer, a divinylbenzene-acrylate copolymer, a diallyl phthalate polymer, a triallyl isocyanurate polymer, and a benzoguanamine polymer. In particular, crosslinked resins are preferable because they enables easy adjustment of hardness and the compression recovery rate of the spacer particles and improvement in heat resistance of the cured product of the adhesive for electronic components.

The spacer particles may be optionally surface-treated. The viscosity of the adhesive for electronic components can be easily adjusted within a desired range by surface-treating the spacer particles.

Examples of the surface-treating method of the spacer particles include a method in which a hydrophilic group is imparted to the surface of the spacer particles in the case that the whole of the adhesive for electronic components has hydrophobicity. Examples of a method for imparting the hydrophilic group to the surface of the spacer particles include a method including treating the surface of the resin particles with a hydrophilic group-containing coupling agent in the case of using the resin particles as the spacer particles.

Preferably, the amount of the spacer particles is 0.01 parts by weight in the lower limit and 1 part by weight in the upper limit, relative to 100 parts by weight of the epoxy compounds (A1). An amount of the spacer particles of less than 0.01 parts by weight may cause difficulty in stably keeping constant the distance between electronic components. An amount of the spacer particles exceeding 1 part by weight may cause difficulty in stably keeping constant the distance between electronic components, or may lead to relatively too small a ratio of other components, likely leading to reduction in coatability of the adhesive for electronic components or in flexibility of the cured product.

The adhesive for electronic components of the present invention may contain an inorganic ion exchanger. If the adhesive contains the inorganic ion exchanger, the ion impurity in the adhesive for electronic components can be trapped, and the corrosion of electrodes of electronic components can be prevented.

Examples of commercial products of the inorganic ion exchanger include IXE series (produced by Toagosei Co., Ltd.).

The adhesive for electronic components of the present invention may contain a thickener in order to adjust the viscosity.

Examples of the thickener include silica particles, ethyl cellulose, and calcium carbide.

If the silica particles are used as a thickener, preferably, the average particle diameter of the silica particles is 5 nm in the lower limit and 50 nm in the upper limit.

Preferably, the amount of the thickener is 1 part by weight in the lower limit and 20 parts by weight in the upper limit, relative to the total amount of 100 parts by weight of all the curable components.

The adhesive for electronic components of the present invention may contain conventional additives such as a bleed inhibitor and adhesion providing agents, if needed.

With respect to the viscosity of the adhesive for electronic components of the present invention measured by an E-type viscometer at 25° C. and at 10 rpm, the preferable lower limit thereof is 5 Pa·s and the preferable upper limit thereof is 30 Pa·s. A viscosity of the adhesive for electronic components of the present invention of less than 5 Pa·s may cause deformation of an application shape due to flowing, upon applying the adhesive for electronic components onto an electronic component. A viscosity of more than 30 Pa·s may cause the adhesive for electronic components not to be applied uniformly or in a desired shape onto an electronic component. The more preferable lower limit thereof is 8 Pa·s and the more preferable upper limit thereof is 20 Pa·s. In the case that a non-filled portion of the adhesive for electronic components may be present between electronic components after bonding the electronic components with the adhesive, a viscosity of the adhesive for electronic components of the present invention exceeding 30 Pa·s may cause the adhesive for electronic components to have difficulty in spreading into the non-filled portion at room temperature due to the surface tension of the electronic components or the adhesive.

In the adhesive for electronic components of the present invention, the value (thixotropic value) obtained by dividing the viscosity measured at 25° C. and 5 rpm with an E type viscometer by the viscosity measured at 25° C. and 0.5 rpm therewith is preferably 2 or more, and 5 or less. A thixotropic value of 2 or more may prevent the transfer of moisture and cause no void to occur even in the case where moisture remains on the substrate. In the case that a non-filled portion of the adhesive for electronic components may be present between electronic components after bonding the electronic components with the adhesive, a thixotropic value exceeding 5 and may cause the adhesive for electronic components to have difficulty in spreading into the non-filled portion at room temperature due to the surface tension of the electronic components or the adhesive.

Preferably, the elastic modulus of the cured product of the adhesive for electronic components of the present invention at the reflow temperature is 6 MPa in the lower limit and 35 MPa in the upper limit. An elastic modulus at the reflow temperature of less than 6 MPa may inhibit sufficient prevention of reflow cracks. An elastic modulus exceeding 35 MPa may inhibit sufficient prevention of warpage of electronic components. More preferably, the elastic modulus of the adhesive for electronic components of the present invention at the reflow temperature is 25 MPa in the upper limit. Further preferably, it is 7 MPa in the lower limit and 20 MPa in the upper limit.

Preferably, the glass transition temperature (Tg) of the cured product of the adhesive for electronic components of the present invention is −20° C. in the lower limit and 25° C. in the upper limit. A glass transition temperature of lower than −20° C. may cause the adhesive for electronic components not to exert sufficient heat resistance. A glass transition temperature exceeding 25° C. may inhibit sufficient prevention of warpage of electronic components. More preferably, the glass transition temperature of the adhesive for electronic components of the present invention is −10° C. in the lower limit and 20° C. in the upper limit. Further preferably, it is −5° C. in the lower limit and 15° C. in the upper limit. Even further preferably, it is 0° C. in the lower limit and 12° C. in the upper limit.

The adhesive for electronic components of the present invention can be produced, for example, as follows. That is, the epoxy compound (A1), the epoxy group-containing acrylic polymer, the episulfide compound, and the curing agent, and optionally other components are mixed with one another, and then the silica particles are mixed to the resulting mixture.

Examples of the mixing method of the above components include a method using a homodisper, a utility mixer, a Banbury mixer, a kneader, or other mixers.

The adhesive for electronic components of the present invention can be suitably used for bonding between electronic components such as semiconductor chips or between electronic components and substrates. The adhesive for electronic components of the present invention prevents warpage of electronic components and reflow cracks even in the case of bonding thin electronic components.

Effects of the Invention

The present invention provides an adhesive for electronic components that prevents warpage of electronic components and reflow cracks even in the case of bonding thin electronic components.

MODES FOR CARRYING OUT THE INVENTION

The following will discuss modes of the present invention in further detail by way of examples, and the present invention is not limited to these examples.

Examples 1 to 18 and Comparative Examples 1 to 4

The ingredients shown in Tables 1, 2, and 3 were mixed in the respective amounts and stirred with a homodisper to prepare an adhesive for electronic components.

The following ingredients were used.
(1) Epoxy Compound (A1)
Epogosey PT (polytetramethylene glycol diglycidyl ether, produced by Yokkaichi Chemical Company, Limited, number-average molecular weight: 900)

EXA-4850-150 (polypropylene glycol backbone-containing epoxy, produced by DIC Corporation, number-average molecular weight: 900)

EXA-4850-1000 (polypropylene glycol backbone-containing epoxy, produced by DIC Corporation, number-average molecular weight: 700)

EP-931 (propylene glycol diglycidyl ether, produced by Nagase ChemteX Corporation, number-average molecular weight: 770)

(2) Epoxy Group-Containing Acrylic Polymer

CP-15 (produced by NOF Corporation, number-average molecular weight: 11000, epoxy equivalent: 1000)

CP-30 (produced by NOF Corporation, number-average molecular weight: 9000, epoxy equivalent: 530)

CP-50M (produced by NOF Corporation, number-average molecular weight: 10000, epoxy equivalent: 310)

CP-50S (produced by NOF Corporation, number-average molecular weight: 20000, epoxy equivalent: 310)

CP-20SAP (produced by NOF Corporation, number-average molecular weight: 8000, epoxy equivalent: 750)

(3) Episulfide Compound

YL-7007 (hydrogenated bisphenol A episulfide compound, produced by Japan Epoxy Resins Co., Ltd.)

(4) Epoxy Compound (A2)

EX-201 (resorcinol epoxy compound, produced by Nagase ChemteX Corporation, molecular weight: 222)

(5) Silica Particles (Filler)

SE-4050-SPE (silica particles surface-treated with a phenyl group-containing silane coupling agent, average particle diameter: 1 μm, produced by Admatechs Company Limited)

SE-4050-SEE (silica particles surface-treated with a epoxy group-containing silane coupling agent, average particle diameter: 1 μm, produced by Admatechs Company Limited)

(6) Curing Agent

DDSA (dodecenyl succinic anhydride, produced by New Japan Chemical Co., Ltd.)

YH-306 (methylbutenyl tetrahydrophthalic anhydride, produced by Japan Epoxy Resins Co., Ltd.)

(7) Curing Accelerator

2MZ-A (imidazole compound, produced by Shikoku Chemicals Corporation)

PN-23J (epoxy adduct type imidazole compound, produced by Ajinomoto Co., Inc.)

(8) Spacer Particles

SP-210 (average particle diameter: 10 μm, produced by Sekisui Chemical Co., Ltd.)

(9) Silane Coupling Agent

KBM-573 (phenylamino propyltrimethoxysilane, produced by Shin-Etsu Chemical Co., Ltd.)

(10) Thickener

PM-20L (fumed silica surface-treated with silicone oil, produced by TOKUYAMA Corp.)

(Evaluation)

Each of the adhesives for electronic components produced in the examples and the comparative examples was evaluated by the following methods.

Table 1, 2, and 3 show the results.

(1) Evaluation of Adhesive for Electronic Components Before Curing (1-1) Measurement of Viscosity The viscosity was measured with an E type viscometer (VISCOMETER TV-22, produced by TOKI SANGYO CO., LTD, rotor used: φ15 mm) at 25° C. and 10 rpm.

(1-2) Evaluation of Coating Stability

The coating stability was evaluated with an air dispenser (SHOT MASTER300, produced by Musashi Engineering, Inc.). The components used were a precision nozzle (produced by Musashi Engineering, Inc., internal diameter: 0.3 mm) and a 10-mL syringe (produced by Musashi Engineering, Inc.). The adhesive was dispensed 40 times, each in a target ejection amount of 5 mg, at an ejection pressure of 0.4 MPa, with a gap between a semiconductor chip and a needle being set to 200 μm.

The following evaluation was made on the coating stability. The case where the difference between the maximum and minimum ejection amounts in 40 times of dispensing was less than 0.3 mg was evaluated as "⊚", the case where the difference between the maximum and the minimum ejection amounts in 40 times of dispensing was 0.3 mg or more, and less than 0.5 mg was evaluated as "○", the case where the difference between the maximum and the minimum ejection amounts in 40 times of dispensing was 0.5 mg or more, and less than 1.0 mg was evaluated as "Δ", and the case where the difference between the maximum and the minimum ejection amounts in 40 times of dispensing was 1.0 mg or greater was evaluated as "x".

(2) Evaluation of Adhesive for Electronic Components after Curing (2-1) Measurement of Elastic Modulus at Reflow Temperature The temperature of the cured product of the adhesive layer made of the adhesive for electronic components was increased from −60° C. to 300° C. at a heating rate of 5° C./min, a tensile and fastening width of 24 mm, and 10 Hz with a viscoelasticity measuring apparatus (model name: "DVA-200", produced by IT Keisoku Seigyo Co., Ltd.), and the elastic modulus (MPa) thereof was measured.

Here, the peak temperature of tan δ was regarded as the glass transition temperature (Tg) (° C.).

(3) Evaluation of Electronic Component Bonded Body (3-1) Evaluation of Warpage of Semiconductor Chip The adhesive for electronic components was charged in a 10-mL syringe (produced by Musashi Engineering, Inc.), a precision nozzle (produced by Musashi Engineering, Inc., nozzle tip diameter: 0.3 mm) was attached to the tip of the syringe, and the adhesive was applied to a glass substrate in an application amount of 5 mg at an ejection pressure of 0.4 MPa using a dispenser device (SHOT MASTER300, produced by Musashi Engineering, Inc.), with a gap between the substrate and a needle being set to 200 μm, whereby an adhesive layer was formed. The adhesive was applied so that the ratio of the application amount to the outer peripheral portion surrounding the central portion of the bonded part to the application amount to the central portion of the bonded part was 4.

A semiconductor chip (thickness: 80 μm, 10 mm×10 mm (square), mesh-like pattern, aluminum wiring: thickness of 0.7 μm, L/S=15/15, thickness of a silicon nitride film on the surface thereof: 1.0 μm) having 172 pieces of 110-μm pad openings on the periphery thereof was prepared. The semiconductor chip was pressed to the organic substrate (produced by Daisho Denshi Co., Ltd., thickness: 180 μm) on which the adhesive layer was formed at a pressure of 0.1 MPa at room temperature for 5 seconds using a flip chip bonder (DB-100, produced by Shibuya Kogyo Co., Ltd.), and thereby laminated. The adhesive layer was cured by heating at 110° C. for 40 minutes and then at 170° C. for 15 minutes to produce an electronic component bonded body.

The height position of the upper surface of the semiconductor chip of the obtained electronic component bonded body was measured with a laser displacement gauge (LT9010M, KS-1100, produced by KEYENCE Corporation), and the warpage amount, which was the maximum difference of the height position on the diagonal line of the semiconductor chip, was determined.

(3-2) Evaluation of Reflow Resistance

The obtained electronic component bonded body was left standing in a constant temperature and humidity oven at 85° C. and a relative humidity of 85% for 48 hours. Thereafter, the electronic component bonded body was put three times into an IR reflow furnace in which the temperature was set to 180°

C. or higher for 20 seconds or more and the highest temperature was set to 260° C. After the reflow treatment, the number of reflow cracks in 30 electronic component bonded bodies was counted with a scanning acoustic tomograph (SAT).

With respect to reflow resistance, the case where the number of reflow cracks was 0 was evaluated as "⊚", the case where the number of reflow cracks was 1 was evaluated as "○", the case where the number of reflow cracks was 2 was evaluated as "Δ", and the case where the number of reflow cracks was 3 or more was evaluated as "x".

(3-3) Evaluation of Gap Holding Capability

Ten samples of the electronic component bonded bodies were produced, and lamination condition of each of the electronic component bonded bodies was measured with a laser displacement gauge (KS-1100, produced by KEYENCE Corporation). Specifically, a level difference between the upper surface of the chip and the substrate was measured and a distance between the chip and the substrate was determined by subtracting the chip thickness from the measured value. The case where the distance between the chip and the substrate in all 10 samples was in the range of 5 to 15 μm was evaluated as "○", and the case where the distance therebetween in any one of the 10 samples is outside the range of 5 to 15 μm was evaluated as "x".

TABLE 1

|  |  |  | Example 1 | Example 2 | Example 3 | Example 4 | Example 5 |
|---|---|---|---|---|---|---|---|
| Composition (parts by weight) | Epoxy compound (A1) | Epogosey PT | 8 | 7 | 8 | 8 | 8 |
|  | Epoxy group-containing acrylic polymer | CP-30 | 2 | 2 | 2 | 2 | 2.5 |
|  | Episulfide compound | YL-7007 | 1 | 2 | 1.5 | 1 | 2 |
|  | Epoxy compound (A2) | EX-201 | 1 | 1 | 0.5 | 1 | 1 |
|  | Curing agent | YH-306 | — | 3 | 3 | — | — |
|  |  | DDSA | 4 | 0 | 0 | 4 | 4 |
|  | Filler | SE-4050-SPE | 10 | 10 | 15 | 20 | — |
|  | Curing accelerator | 2MZA | 0.2 | — | 0.3 | 0.2 | 0.2 |
|  |  | PN-23J | — | 0.7 | — | — | — |
|  | Spacer | SP-210 | 0.1 | 0.2 | 0.2 | 0.1 | 0.1 |
|  | Silane coupling agent | KBM-573 | 0.2 | 0.3 | 0.2 | 0.2 | 0.2 |
|  | Thickener | PM-20L | 0.8 | 0.8 | 0.8 | 0.8 | 0.8 |
| Evaluation | Evaluation before curing | Viscosity (Pa · s) | 12 | 14 | 14 | 18 | 14 |
|  |  | Coating stability | ⊚ | ○ | ○ | ○ | ○ |
|  | Evaluation of electronic component bonded body | Chip warpage | 30 | 60 | 50 | 60 | 30 |
|  |  | Reflow resistance | ○ | ⊚ | ⊚ | ⊚ | ○ |
|  |  | Gap holding capability | ○ | ○ | ○ | ○ | ○ |
|  | Glass transition temperature (Tg) | (° C.) | 0 | 10 | 11 | 1 | 1 |
|  | Elastic modulus at reflow temperature | 260° C. | 8 | 10 | 9 | 11 | 8 |

|  |  |  | Example 6 | Example 7 | Example 8 | Example 9 |
|---|---|---|---|---|---|---|
| Composition (parts by weight) | Epoxy compound (A1) | Epogosey PT | 8 | 8 | 8 | 8 |
|  | Epoxy group-containing acrylic polymer | CP-30 | 2 | 3.5 | 2 | 2 |
|  | Episulfide compound | YL-7007 | 0.4 | 2 | 1 | 1 |
|  | Epoxy compound (A2) | EX-201 | 1 | 1 | 1 | — |
|  | Curing agent | YH-306 | — | — | — | — |
|  |  | DDSA | 4 | 4 | 4 | 4 |
|  | Filler | SE-4050-SPE | 10 | 10 | 35 | 10 |
|  | Curing accelerator | 2MZA | 0.2 | 0.2 | 0.2 | 0.2 |
|  |  | PN-23J | — | — | — | — |
|  | Spacer | SP-210 | 0.1 | 0.1 | 0.1 | 0.1 |
|  | Silane coupling agent | KBM-573 | 0.2 | 0.2 | 0.2 | 0.2 |
|  | Thickener | PM-20L | 0.8 | 0.8 | 0.5 | 0.8 |
| Evaluation | Evaluation before curing | Viscosity (Pa · s) | 10 | 20 | 25 | 14 |
|  |  | Coating stability | ⊚ | Δ | Δ | ○ |
|  | Evaluation of electronic component bonded body | Chip warpage | 25 | 40 | 110 | 25 |
|  |  | Reflow resistance | Δ | ⊚ | ○ | ○ |
|  |  | Gap holding capability | ○ | ○ | ○ | ○ |
|  | Glass transition temperature (Tg) | (° C.) | 2 | 3 | 2 | 2 |
|  | Elastic modulus at reflow temperature | 260° C. | 7 | 9 | 20 | 7 |

TABLE 2

|  |  |  | Example 10 | Example 11 | Example 12 | Example 13 | Example 14 |
|---|---|---|---|---|---|---|---|
| Composition (parts by weight) | Epoxy compound (A1) | EXA-4850-150 | — | — | — | — | — |
|  |  | EXA-4850-1000 | — | — | — | — | — |
|  |  | EX-931 | — | — | — | — | — |
|  |  | Epogosey PT | 8 | 8 | 8 | 8 | 8 |

TABLE 2-continued

|  |  |  |  |  |  |  |  |
|---|---|---|---|---|---|---|---|
|  | Epoxy group-containing acrylic polymer | CP-15 | 2 | 2 | — | — | — |
|  |  | CP-30 | — | — | — | — | — |
|  |  | CP-50M | — | — | 2 | — | — |
|  |  | CP-50S | — | — | — | 2 | — |
|  |  | CP-20SAP | — | — | — | — | 2 |
|  | Episulfide compound | YL-7007 | 1 | 1.5 | 1.5 | 1.5 | 1 |
|  | Epoxy compound (A2) | EX-201 | 1 | 1 | 1 | 1 | 1 |
|  | Curing agent | YH-306 | 2 | 2 | 2 | 2 | 2 |
|  |  | DDSA | 2 | 2 | 2 | 2 | 2 |
|  | Filler | SE-4050-SEE | — | — | — | — | — |
|  |  | SE-4050-SPE | 10 | 20 | 15 | 15 | 10 |
|  | Curing accelerator | 2MZA | 0.2 | 0.2 | 0.2 | 0.2 | 0.2 |
|  |  | PN-23J | — | — | — | — | — |
|  | Spacer | SP-210 | 0.1 | 0.1 | 0.1 | 0.1 | 0.1 |
|  | Silane coupling agent | KBM-573 | 0.2 | 0.2 | 0.2 | 0.2 | 0.2 |
|  | Thickener | PM-20L | 0.8 | 0.8 | 0.8 | 0.8 | 0.8 |
| Evaluation | Evaluation before curing | Viscosity (Pa·s) | 12 | 19 | 12 | 18 | 12 |
|  |  | Coating stability | ◎ | ○ | ◎ | ○ | ◎ |
|  | Evaluation of electronic component bonded body | Chip warpage | 30 | 70 | 70 | 70 | 40 |
|  |  | Reflow resistance | Δ | ○ | ○ | ◎ | ○ |
|  |  | Gap holding capability | ○ | ○ | ○ | ○ | ○ |
|  | Glass transition temperature (Tg) | (° C.) | 0 | 0 | 1 | 3 | 2 |
|  | Elastic modulus at reflow temperature | 260° C. | 6 | 12 | 12 | 12 | 7 |

|  |  |  | Example 15 | Example 16 | Example 17 | Example 18 |
|---|---|---|---|---|---|---|
| Composition (parts by weight) | Epoxy compound (A1) | EXA-4850-150 | 8 | — | — | — |
|  |  | EXA-4850-1000 | — | 6 | — | — |
|  |  | EX-931 | — | — | 8 | — |
|  |  | Epogosey PT | — | 2 | — | 8 |
|  | Epoxy group-containing acrylic polymer | CP-15 | — | — | — | — |
|  |  | CP-30 | 2 | 2 | 2 | 2 |
|  |  | CP-50M | — | — | — | — |
|  |  | CP-50S | — | — | — | — |
|  |  | CP-20SAP | — | — | — | — |
|  | Episulfide compound | YL-7007 | 1 | 1 | 2 | 1 |
|  | Epoxy compound (A2) | EX-201 | 1 | 1 | 1 | 1 |
|  | Curing agent | YH-306 | 2 | 2 | 2 | 2 |
|  |  | DDSA | 2 | 2 | 2 | 2 |
|  | Filler | SE-4050-SEE | — | — | — | 10 |
|  |  | SE-4050-SPE | 10 | 10 | 20 | — |
|  | Curing accelerator | 2MZA | 0.2 | 0.2 | 0.2 | 0.2 |
|  |  | PN-23J | — | — | — | — |
|  | Spacer | SP-210 | 0.1 | 0.1 | 0.1 | 0.1 |
|  | Silane coupling agent | KBM-573 | 0.2 | 0.2 | 0.2 | 0.2 |
|  | Thickener | PM-20L | 0.8 | 0.4 | 0.8 | 0.8 |
| Evaluation | Evaluation before curing | Viscosity (Pa·s) | 19 | 25 | 10 | 20 |
|  |  | Coating stability | ○ | Δ | ◎ | Δ |
|  | Evaluation of electronic component bonded body | Chip warpage | 90 | 120 | 40 | 30 |
|  |  | Reflow resistance | ◎ | ◎ | ○ | ○ |
|  |  | Gap holding capability | ○ | ○ | ○ | ○ |
|  | Glass transition temperature (Tg) | (° C.) | 0 | 0 | 2 | 0 |
|  | Elastic modulus at reflow temperature | 260° C. | 15 | 25 | 7 | 6 |

TABLE 3

|  |  |  | Comparative Example 1 | Comparative Example 2 | Comparative Example 3 | Comparative Example 4 |
|---|---|---|---|---|---|---|
| Composition (parts by weight) | Epoxy compound (A1) | Epogosey PT | 8 | 8 | 6 | 4 |
|  | Epoxy group-containing acrylic polymer | CP-30 | — | 2 | 2 | 2 |
|  | Episulfide compound | YL-7007 | 1 | — | 3 | 5 |
|  | Epoxy compound (A2) | EX-201 | 1 | 1 | 2 | 1 |
|  | Curing agent | DDSA | 4 | 4 | 4 | 4 |
|  | Filler | SE-4050-SPE | 10 | 10 | 10 | 15 |
|  | Curing accelerator | 2MZA | 0.2 | 0.2 | 0.2 | 0.2 |
|  |  | PN-23J | — | — | — | — |
|  | Spacer | SP-210 | 0.1 | 0.1 | 0.1 | 0.1 |
|  | Silane coupling agent | KBM-573 | 0.2 | 0.5 | 0.2 | 0.2 |
|  | Thickener | PM-20L | 0.8 | 0.8 | 0.8 | 0.8 |

TABLE 3-continued

|  |  |  | Comparative Example 1 | Comparative Example 2 | Comparative Example 3 | Comparative Example 4 |
|---|---|---|---|---|---|---|
| Evaluation | Evaluation before curing | Viscosity (Pa · s) | 10 | 10 | 12 | 30 |
|  |  | Coating stability | ⊚ | ⊚ | ⊚ | X |
|  | Evaluation of electronic component bonded body | Chip warpage | 30 | 25 | 150 | 160 |
|  |  | Reflow resistance | X | X | ⊚ | ⊚ |
|  |  | Gap holding capability | ○ | ○ | ○ | ○ |
|  | Glass transition temperature (Tg) | (° C.) | 0 | 0 | 30 | 40 |
|  | Elastic modulus at reflow temperature | 260° C. | 5 | 5 | 40 | 45 |

INDUSTRIAL APPLICABILITY

The present invention provides an adhesive for electronic components that prevents warpage of electronic components and reflow cracks even in the case of bonding thin electronic components.

The invention claimed is:

1. An adhesive for electronic components, comprising:
an epoxy compound having an aliphatic polyether backbone and a glycidyl ether group;
an epoxy group-containing acrylic polymer;
an episulfide compound; and
a curing agent,
wherein the epoxy compound having an aliphatic polyether backbone and a glycidyl ether group has a number-average molecular weight of 800 to 10000,
wherein the epoxy group-containing acrylic polymer has an epoxy equivalent of 300 to 1000 and a number-average molecular weight of 5000 to 50000,
wherein the amount of the episulfide compound is 1 part by weight or more, and less than 30 parts by weight, relative to 100 parts by weight of the epoxy compound having an aliphatic polyether backbone and a glycidyl ether group,
wherein the amount of the epoxy group-containing acrylic polymer is 4 part by weight or more, and less than 40 parts by weight, relative to 100 parts by weight of the epoxy compound having an aliphatic polyether backbone and a glycidyl ether group, and
further comprising 1 to 20 parts by weight of an epoxy compound having an aromatic skeleton and a number-average molecular weight of 150 to 500, relative to 100 parts by weight of the epoxy compound having an aliphatic polyether backbone and a glycidyl ether group.

2. The adhesive for electronic components according to claim 1, wherein the episulfide compound is a hydrogenated bisphenol episulfide compound.

3. The adhesive for electronic components according to claim 1, wherein the curing agent is an acid anhydride curing agent.

4. The adhesive for electronic components according to claim 1, further comprising:
50 to 400 parts by weight of silica particles relative to 100 parts by weight of the epoxy compound having an aliphatic polyether backbone and a glycidyl ether group.

5. The adhesive for electronic components according to claim 4,
wherein the silica particles are surface-treated with a phenyl group-containing silane coupling agent.

6. The adhesive for electronic components according to claim 1, further comprising:
spacer particles.

* * * * *